(12) United States Patent
Lee et al.

(10) Patent No.: US 7,638,396 B2
(45) Date of Patent: Dec. 29, 2009

(54) METHODS FOR FABRICATING A SEMICONDUCTOR DEVICE

(75) Inventors: Da-Yuan Lee, Kaohsiung (TW); Chi-Chun Chen, Kaohsiung (TW); Shih-Chang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 27 days.

(21) Appl. No.: 11/725,453

(22) Filed: Mar. 20, 2007

(65) Prior Publication Data

US 2008/0230814 A1 Sep. 25, 2008

(51) Int. Cl.
*H01L 21/8234* (2006.01)

(52) U.S. Cl. .................. 438/275; 438/276; 438/400; 438/405; 438/423; 438/433; 257/E21.302

(58) Field of Classification Search .................. 438/275, 438/276, 400, 405, 423, 433; 257/E21.302
See application file for complete search history.

(56) References Cited

U.S. PATENT DOCUMENTS

| | | | |
|---|---|---|---|
| 6,417,051 B1 * | 7/2002 | Takebuchi | 438/287 |
| 6,465,323 B1 * | 10/2002 | Yu et al. | 438/424 |
| 6,756,635 B2 * | 6/2004 | Yasuda et al. | 257/325 |
| 7,250,654 B2 * | 7/2007 | Chen et al. | 257/324 |
| 7,323,420 B2 * | 1/2008 | Kim et al. | 438/723 |
| 7,459,390 B2 * | 12/2008 | Niimi et al. | 438/622 |
| 2001/0049186 A1 | 12/2001 | Ibok | |
| 2003/0057432 A1 | 3/2003 | Gardner et al. | |
| 2003/0181012 A1 | 9/2003 | Wang et al. | |
| 2005/0029600 A1 | 2/2005 | Tsujikawa et al. | |
| 2007/0122981 A1 * | 5/2007 | Park | 438/275 |

* cited by examiner

*Primary Examiner*—Matthew Smith
*Assistant Examiner*—John M Parker
(74) *Attorney, Agent, or Firm*—Birch, Stewart, Kolasch & Birch, LLP (57) ABSTRACT

A method for fabricating a semiconductor device comprises providing a silicon-containing substrate with first, second, and third regions. First, second, and third gate stacks respectively overlie a portion of the silicon-containing substrate in the first, second, and third regions. A spacer is formed on opposing sidewalls of each of the first, second, and third gate stacks, the spacer overlying a portion of the silicon-containing substrate in the first, second, and third regions, respectively. A source/drain region is formed in a portion of the silicon-containing substrate in the first, second, and third regions, with the source/drain region adjacent to the first, second, and third gate stacks, respectively. The first, second, and third gate stacks have first, second, and third gate dielectric layers of various thicknesses and at least one thereof with a relatively thin thickness is treated by $NH_3$-plasma, having a nitrogen-concentration of about $10^{13} \sim 10^{21}$ atoms/cm$^2$ therein.

11 Claims, 6 Drawing Sheets

METHODS FOR FABRICATING A SEMICONDUCTOR DEVICE

BACKGROUND

The invention relates to a semiconductor device formed by integrating MOS (Metal-Oxide-Semiconductor) devices, and in particular to a semiconductor device having gate dielectrics for a plurality of different types of MOS devices, as well as a method for fabrication thereof.

In semiconductor devices comprising MOS devices such as MOS transistors as basic constituent elements, those utilizing MOS devices of different required performances such as memory cells and peripheral circuits, digital circuits and analog circuits, and devices requiring high speed operation and devices requiring low power consumption are present together are used more often. To satisfy respective performance requirements for different MOS devices, it is effective to form multiple MOS devices having gate dielectrics different from each other. The technique for attaining the same includes, for example, a multi-level gate dielectric technique. Semiconductor devices having multiple MOS devices formed by disposing silicon dioxides of multi-level thickness together have been generally mass produced.

In United States Patent Application Publication No. US2005/0029600A1, Tsujikawa et al. disclose a method for forming a semiconductor device of 3-thickness level comprising a gate dielectric formed of oxygen-containing silicon nitride, a gate dielectric formed of silicon dioxide not substantially containing nitrogen, and a gate dielectric formed of nitrogen-containing silicon dioxide. However, in the above method, a gate dielectric in a first domain is covered by a sequentially formed CVD silicon dioxide layer. Since the gate dielectric also comprises silicon dioxide, such that the gate dielectric may be over-etched and reined in a sequential DHF solution for removing the portion of the CVD silicon dioxide layer covering thereof or the CVD silicon dioxide layer covering the gate dielectric in the first domain may be insufficiently removed. Functionality of a semiconductor device of such 3-thickness level is thus degraded.

SUMMARY

Therefore, an improved method for fabricating a semiconductor device with multi-thickness level gate dielectric is provided, especially for a semiconductor device of two more gate dielectric thickness level gate dielectric.

An exemplary method for fabricating a semiconductor device comprises providing a silicon-containing substrate with first, second, and third regions. First, second, and third gate stacks are formed, respectively overlying a portion of the silicon-containing substrate in the first, second, and third regions, wherein the first, second, and third gate stacks respectively have a conducting layer and a first, second, and third gate dielectric layers formed between the conducting layer and the silicon-containing substrate. A spacer is formed on opposing sidewalls of the each of the first, second, and third gate stacks, the spacer overlying a portion of the silicon-containing substrate in the first, second, and third regions, respectively. A source/drain region is formed in a portion of the silicon-containing substrate in the first, second, and third regions, with the source/drain region adjacent to the first, second, and third gate stacks, respectively. The first, second, and third gate dielectric layers have various thicknesses with at least one of the first, second, and third gate dielectric layers of relatively thin thickness treated by $NH_3$-plasma and having a nitrogen-concentration of about $10^{13} \sim 10^{17}$ atoms/cm² therein.

Another exemplary method for fabricating a semiconductor device comprises providing a silicon-containing substrate with first, second, and third regions. The silicon-containing substrate is oxidized in a first ambient to form a first silicon dioxide layer overlying the silicon-containing substrate in the first, second, and third regions, wherein the first oxide layer has a first thickness. The portion of the first silicon dioxide layer in the first and third regions is masked with a first patterned mask layer to expose the portion of the first silicon dioxide layer in the second region. The silicon dioxide layer in the second region is removed and exposes a top surface of the silicon-containing substrate in the second region. The first patterned mask layer is removed and the silicon-containing substrate is oxidized in a second ambient to form a second silicon dioxide layer overlying the silicon-containing substrate in the second region and a thickened first silicon dioxide layer in the first and third regions of the silicon-containing substrate, wherein the second oxide layer has a second thickness and the thickened first silicon dioxide layer has a third thickness exceeding the second thickness. The portion of the thickened first silicon dioxide layer in the first region and the second silicon dioxide layer in the second region are masked with a second patterned mask layer to expose the portion of the thickened first silicon dioxide layer in the third region. The thickened first silicon dioxide layer in the third region is removed to expose a top surface of the silicon-containing substrate in the third region. The second patterned mask layer is removed to leave the portion of the first silicon dioxide layer in the first region and the second oxide layer in the second region. The silicon-containing substrate is oxidized in a third ambient to form a third silicon dioxide layer overlying the silicon-containing substrate in the third region and a further thickened first silicon dioxide layer in the first region and a thickened second silicon dioxide layer in the second region, wherein the third silicon dioxide layer has a fourth thickness, the further thickened first silicon dioxide layer has a fifth thickness and the thickened second silicon dioxide layer has a sixth thickness, both exceeding the fourth thickness, wherein the first ambient comprises no $NH_3$ plasma and at least one of the second and third ambients comprises $NH_3$ plasma.

Yet another exemplary method for fabricating a semiconductor device comprises providing a silicon-containing substrate with first, second, and third regions. The silicon-containing substrate is oxidized in a first ambient to form a first silicon dioxide layer overlying the silicon-containing substrate in the first, second, and third regions, wherein the first oxide layer has a first thickness. The portion of the first silicon dioxide layer in the first and third regions is masked with a first patterned mask layer to expose the portion of the first silicon dioxide layer in the second region. The silicon dioxide layer in the second region is removed to expose a top surface of the silicon-containing substrate in the second region. The first patterned mask layer is removed and the silicon-containing substrate is oxidized in a second ambient to form a second silicon dioxide layer overlying the silicon-containing substrate in the second region and a thickened first silicon dioxide layer in the first and third regions, wherein the second oxide layer has a second thickness and the thickened first silicon dioxide layer has a third thickness exceeding the second thickness. The portions of the thickened first silicon dioxide layer in the first region and the second silicon dioxide layer in the second region are masked with a second patterned mask layer to expose the portion of the thickened first silicon dioxide layer in the third region. The portion of the thickened first silicon dioxide layer in the third region is removed to expose a top surface of the silicon-containing substrate in the third region. The second patterned mask layer is removed to leave the portion of the first silicon dioxide layer in the first region and the second oxide layer in the second region. The silicon-containing substrate is oxidized in a third ambient to form a third silicon dioxide layer overlying the silicon-containing substrate in the third region, a further thickened first silicon dioxide layer in the first region, and a thickened second silicon dioxide layer in the second region, wherein the third silicon dioxide layer has a fourth thickness, the further thickened first silicon dioxide layer in the first region has a fifth thickness and the thickened second silicon dioxide layer in the second region has a sixth thickness, all exceeding the fourth thickness. The silicon-containing substrate is treated with $NH_3$-containing plasma to dope the further thickened first silicon dioxide layer, the thickened second silicon dioxide layer and the third silicon dioxide layer with nitrogen atoms.

An exemplary semiconductor device comprises a silicon-containing substrate with first, second, and third regions. First, second, and third gate stacks respectively overlie a portion of the silicon-containing substrate in the first, second, and third regions respectively, wherein the first, second, and third gate stacks have a conducting layer overlying the silicon-containing substrate and first, second, and third gate dielectric layers formed between the conducting layer and the silicon-containing substrate, and the first, second, and third gate dielectric layers have various thicknesses. A spacer is formed on opposing sidewalls of the each of the first, second, and third gate stacks, overlying the portion of the silicon-containing substrate in the first, second, and third regions. A source/drain region formed in a portion of the silicon-containing substrate in the first, second, and third regions, the source/drain region adjacent to the first, second, and third gate stacks, respectively, wherein at least one of the first, second, and third gate dielectric layers having relatively thin thickness bring treated by $NH_3$-plasma and having a nitrogen-concentration of about $10^{13}$~$10^{17}$ atoms/cm$^2$ therein.

A detailed description is given in the following embodiments with reference to the accompanying drawings.

BRIEF DESCRIPTION OF THE DRAWINGS The invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1 to 6 show a method of manufacturing a semiconductor device of 3-thickness gate dielectric level according to an exemplary embodiment.

Figure 1:
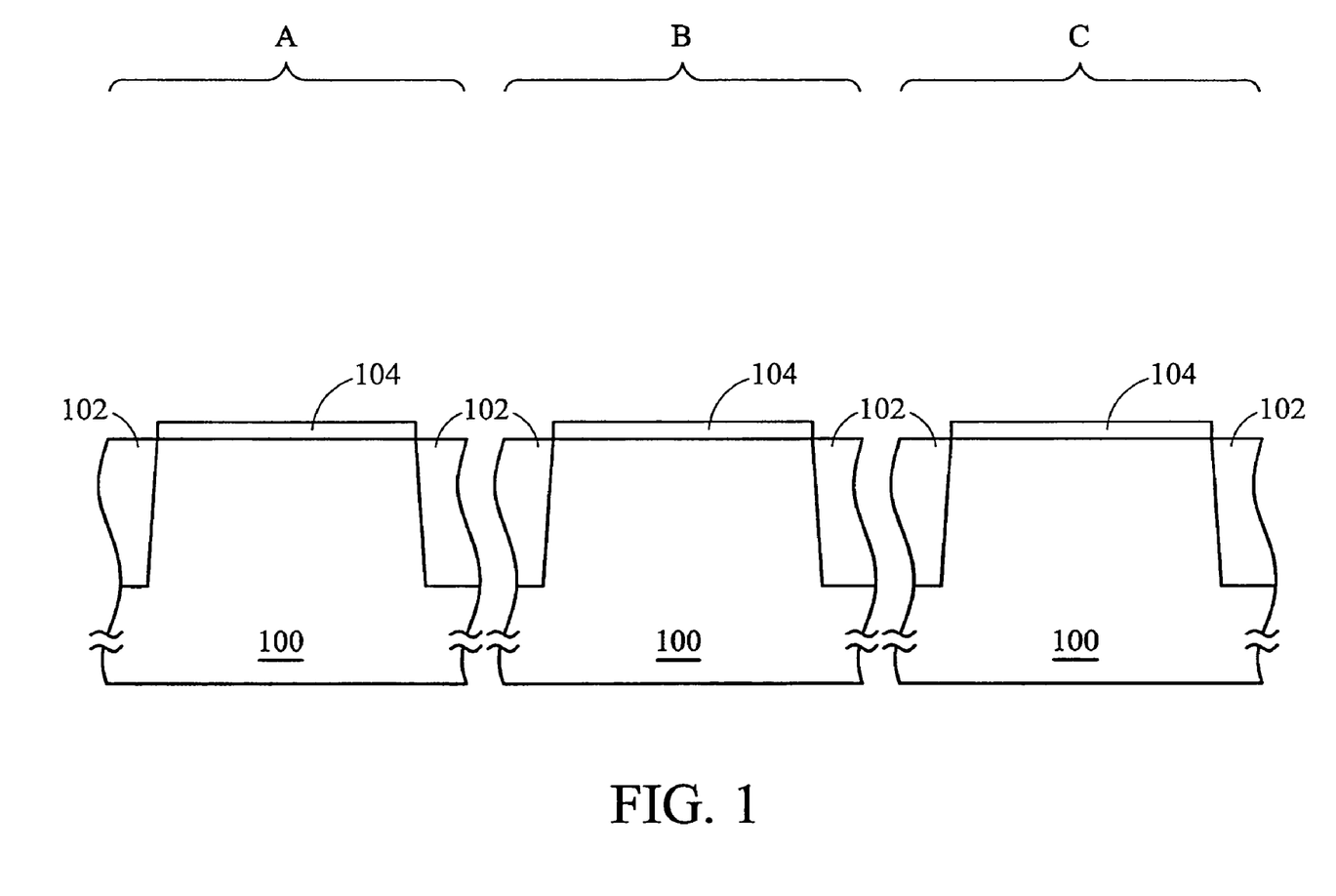
FIGS. 1-6 are cross sections of a method of fabricating a semiconductor device according to an embodiment of the invention.

As shown in FIG. 1, a substrate 100 is first provided. A plurality of isolation structures 102 is formed in the substrate 100, defining the substrate 100 with at least three regions A, B, and C thereon. The substrate 100 is a silicon-containing substrate such as a bulk silicon substrate, a SiGe substrate, or a silicon-containing layer of a semiconductor-on-insulator (SOI) substrate (not shown) comprising silicon or SiGe. The isolation structures 102 in FIG. 1 are illustrated as shallow trench isolation (STI) structures but are not limited thereto, and conventional field oxide (FOX) structures may also be used. Next, an oxidation process (not shown) is performed on the substrate 100 and the surface thereof is oxidized in an ambient comprising oxygen. Thus, a silicon dioxide layer 104 of about 15~100 Å is formed on the surface of the substrate 100 between the isolation structures 102. The oxidation process can be, for example, a wet oxidation or dry oxidation performed at about 600~1150° C.

Figure 2:
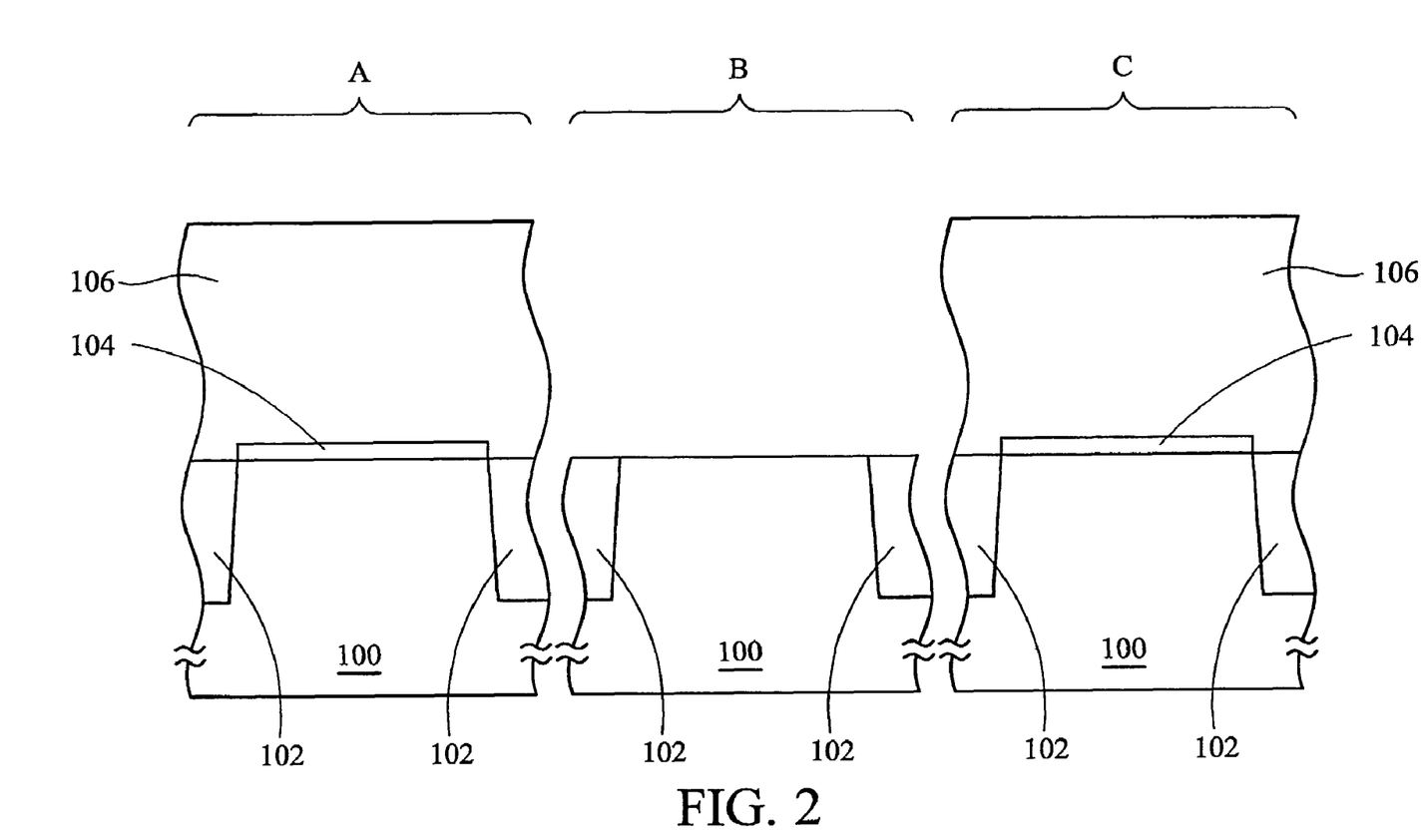

As shown in FIG. 2, a mask layer 106 is formed over the substrate 100 to cover the entire substrate 100. The portion of the mask layer 106 formed in the region B is then selectively removed, thereby exposing the portion of the silicon dioxide layer 104 in the region B. The mask layer 106 can be a resist layer and removal of the portion of the mask layer 106 in region B can be thus achieved by photolithography. Next, the silicon dioxide layer 104 exposed in the region B is etched and removed from the surface of the substrate 100 in the region B by an etching such as wet etching using dilute HF (DHF) solution. Thus, a top surface of the substrate 100 in the region B is again exposed.

Figure 3:
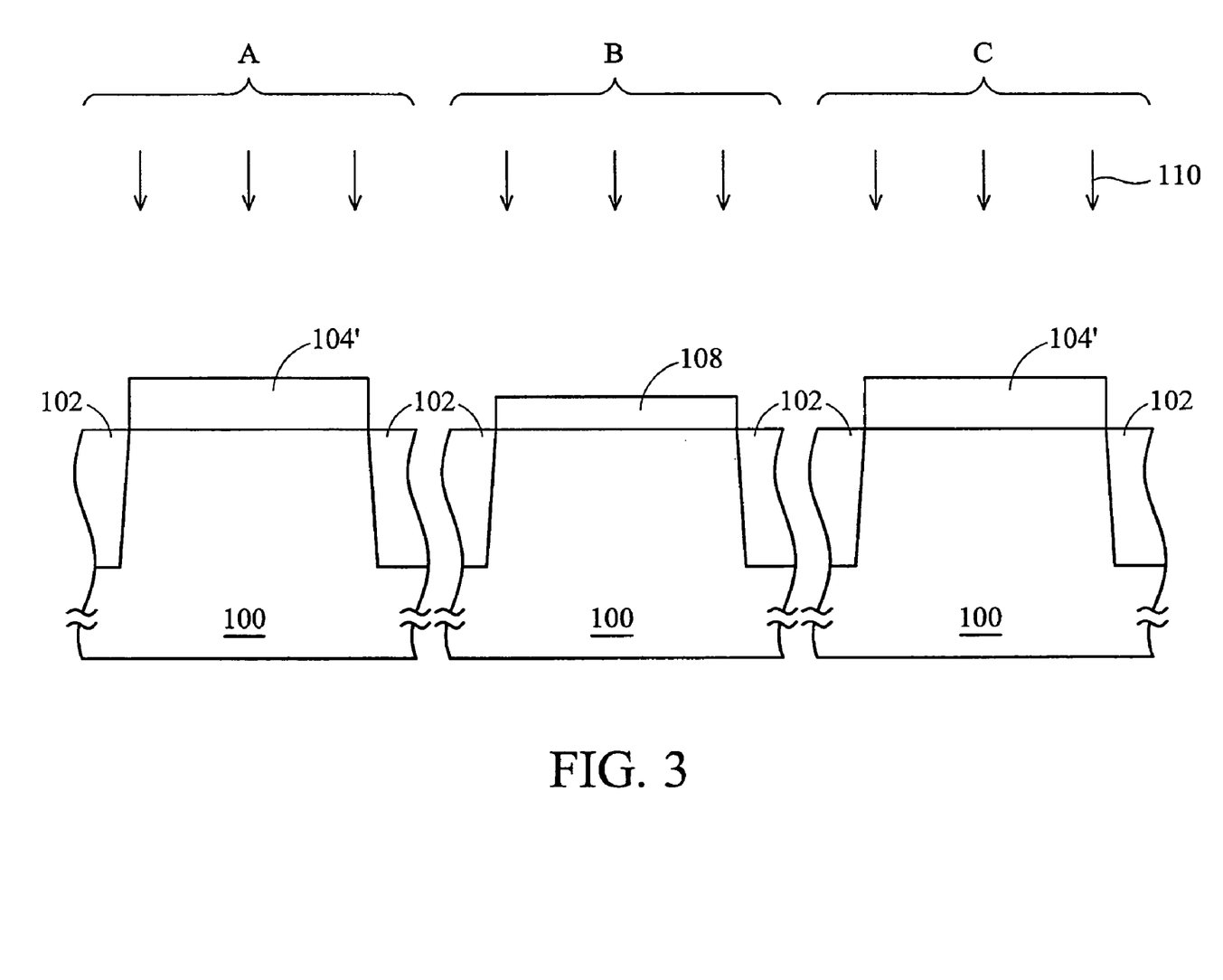

As shown in FIG. 3, the remaining mask layer 106 over the substrate 100 respectively in regions A and C is then removed by, for example, an aqueous solution containing $H_2SO4$ and an $H_2O_2$. Subsequently, SC-1 cleaning and SC-2 cleaning are conducted to remove contaminants from the surface of the substrate 100 and the silicon dioxide layers 104 (See FIG. 2). Further, after conducting SC-1 cleaning and SC-2 cleaning, another oxidation process (not shown) is again performed on the substrate 100 and the surface thereof is oxidized in an ambient comprising oxygen. Thus, a silicon dioxide layer 108 of about 15~70 Å is formed on the surface of the substrate 100 in the region B and the substrate 100 in the regions A and C are again oxidized, thereby forming a thickened silicon dioxide layer 104' in each of the regions A and C, each having a thickness of about 17~100 Å. Thickness of the thickened silicon dioxide layer 104' is now greater than that of the silicon dioxide layer 108. The oxidation process performed can be, for example, a wet oxidation or dry oxidation performed at about 600~1150° C. After formation of the silicon dioxide layers 104' and 108, a nitridation process 110 is performed on the substrate 100 to treat the substrate 100 and the silicon dioxide layer 104' and 108 formed thereon with an $NH_3$-containing plasma. The nitridation process 110 may be performed under an effective power of about 12~2500 W and a $NH_3$ gas flow rate of about 100~5000 sccm. Thus, nitrogen atoms can be doped into the silicon dioxide layer 104' and 108. The oxidation and nitridation processes performed on the substrate 100 can be simultaneously performed by a rapid thermal process (RTP) tool or sequentially performed in a furnace oxidation step and a plasma treating step by a plasma containing reactor.

Figure 4:
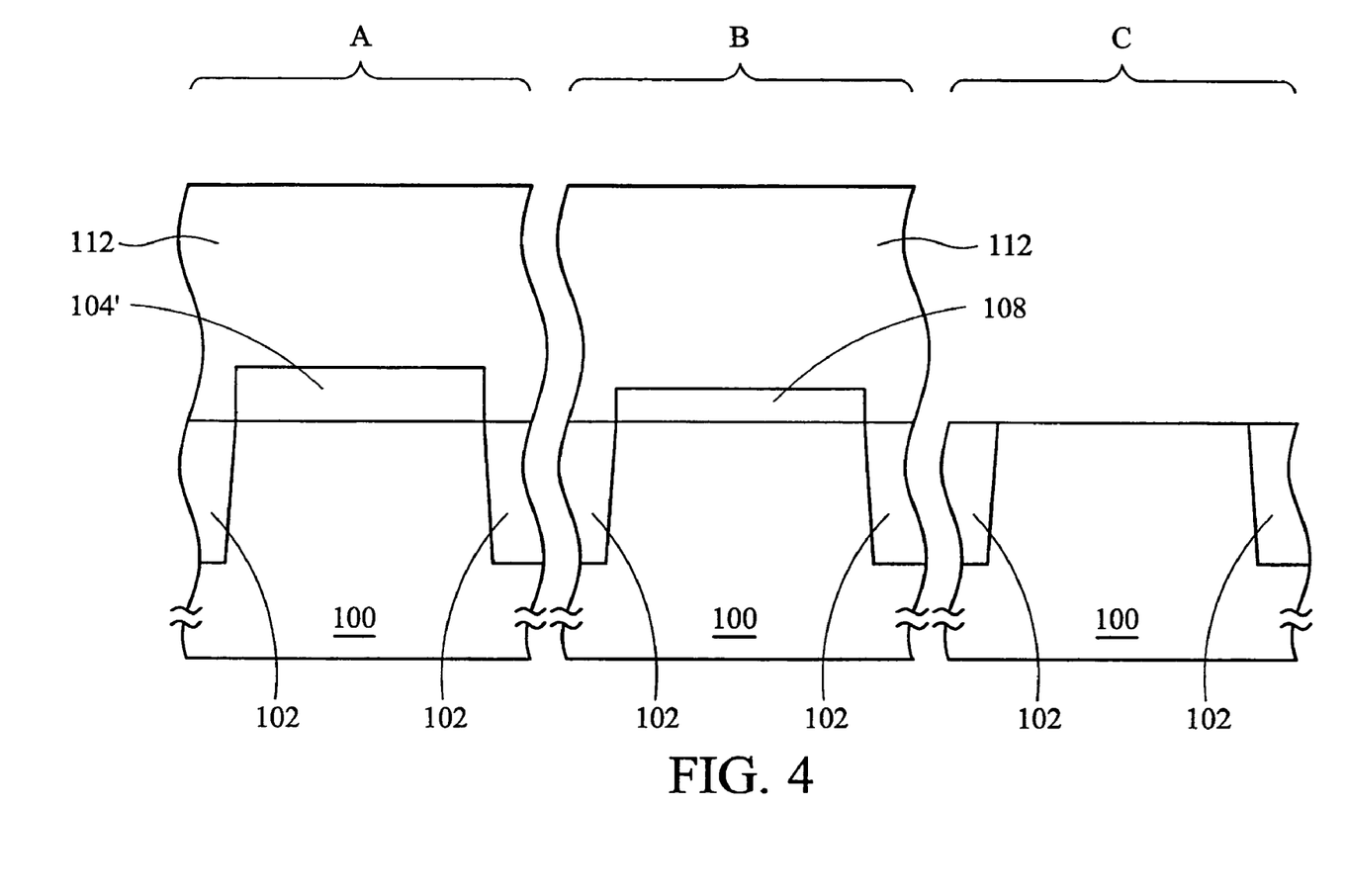

As shown in FIG. 4, a mask layer 112 is again formed over the substrate 100 to cover the entire substrate 100. The portion of the mask layer 112 in the region C is then removed, thereby exposing the portion of the silicon dioxide layer 104' in the region C. The mask layer 112 can be a resist layer and removal of the portion of the mask layer 112 in the region C can be achieved by photolithography. Next, the silicon dioxide layer 104' (see FIG. 3) exposed in the region C is etched and removed from the surface of the substrate 100 by a etching process (not shown) such as a wet etching using dilute HF solution. Thus, a top surface of the substrate 100 in the region C is exposed.

Figure 5:
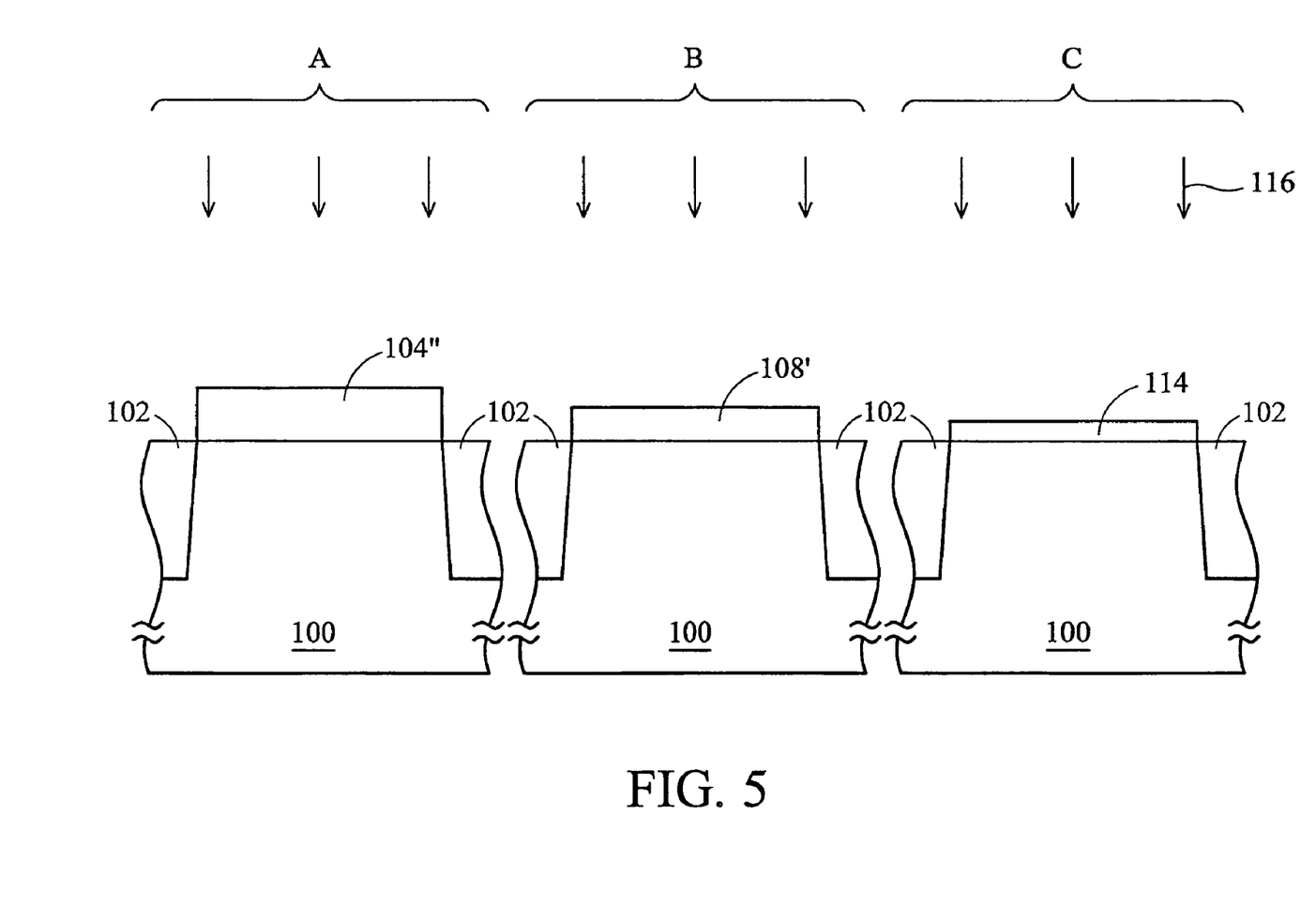

As shown in FIG. 5, the portion of the mask layer 112 remaining over the substrate 100 in region A and B is then removed by, for example, an aqueous solution containing $H_2SO_4$ and an $H_2O_2$. Subsequently, SC-1 cleaning and SC-2 cleaning are conducted to remove contaminants from the surface of the substrate 100 and the silicon dioxide layers 104' and 108 (See FIG. 4). Further, after conducting SC-1 cleaning and SC-2 cleaning, yet another oxidation process (not shown) is performed on the substrate 100 and the surface thereof is oxidized in an ambient comprising oxygen. Thus, a silicon dioxide layer 114 of about 10~25 Å is formed on the surface of the substrate 100 in the region C and the substrate in regions A and B is also oxidized, thereby forming a silicon dioxide layers 104" and 108 with further increased thicknesses, resulting in silicon dioxide layer 104" in the region A having a thickness of about 20~110 Å and the silicon dioxide layer 108 a thickness of about 17~55 Å, both exceeding that of the silicon dioxide layer 114. The oxidation process can be, for example, a wet oxidation or dry oxidation performed at about 600~1100° C. After formation of the silicon dioxide layers 114, 104" and 108', a nitridation process 116 is performed on the substrate 100, using $NH_3$-containing plasma, to treat the substrate 100 and the silicon dioxide layer 104' and 108 formed on the substrate 100. The nitridation process 116 may be performed under an effective power of about 12~2500 W and a $NH_3$ gas flow rate of about 100~5000 sccm. Thus, nitrogen atoms are doped into the silicon dioxide layer 104" and 108' and 114 thereon. The oxidation and nitridation performed on the substrate 100 can be simultaneously performed by a rapid thermal process (RTP) tool or sequentially performed in a furnace oxidation step and a plasma treating step by a plasma containing reactor. As shown in FIG. 5, a substrate 100 with 3-thickness silicon dioxide level is provided, with each of the silicon dioxide layers 104", 108' and 114 capable of functioning as a gate dielectric layer.

Figure 6:
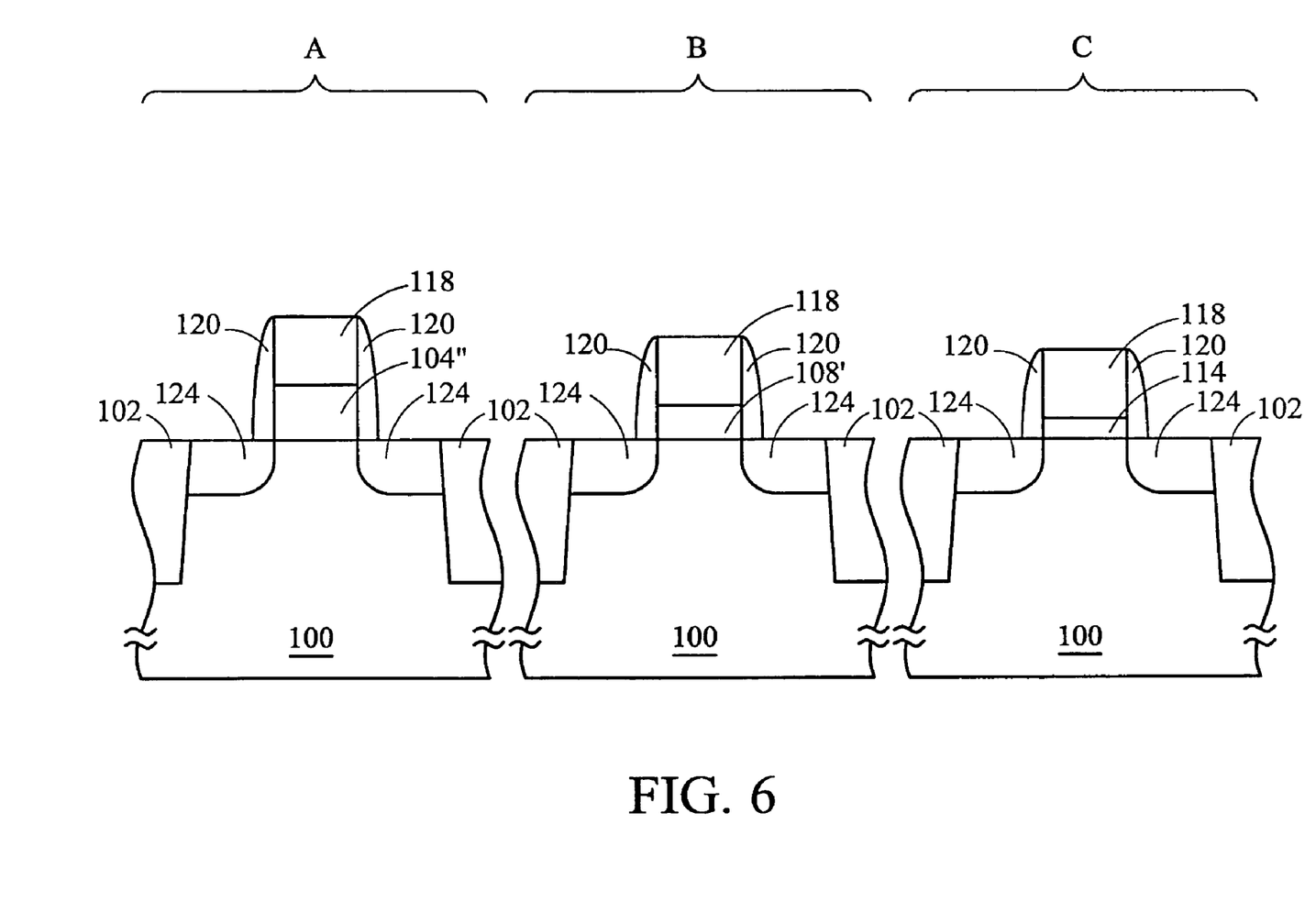

As shown in FIG. 6, the substrate 100 having the silicon dioxide layers 104", 108' and 114 respectively with various thicknesses formed in the different regions A, B, and C (See FIG. 5) is provided as a substrate with a 3-thickness gate dielectric level. Sequential processes for fabricating semiconductor devices such as MOS devices can be further performed on the substrate 100 (not shown) to form a conductive layer 118 respectively overlying each of the gate dielectric layers (referring to the silicon dioxide layers 104", 108' and 114). The conductive layer 118 and the gate dielectric layers in the regions A, B, and C are than patterned, thereby forming three gate stacks of various gate dielectric thicknesses overlying a portion of the substrate 100. Next, a spacer 120 can be formed on opposing sidewalls of the each of the gate stacks in the regions A, B, and C. Each of the spacers overlies a portion of the substrate 100 in the regions A, B, and C. A source/drain region 124 is next formed in a portion of the substrate 100 in the regions A, B, and C, respectively adjacent to one of the gate stacks. Thus, a MOS device with different gate dielectric thickness is formed in each of the regions A, B, and C. Accordingly, MOS devices of different required performances such as memory cells and peripheral circuits, digital circuits and analog circuits, and devices requiring high speed operation and devices requiring low power consumption operation are enabled together. Since the silicon dioxide layer 104" in the region A is formed with a relatively thick thickness, the MOS device formed in the region A may function as a power supply device. The silicon dioxide layer 108' and 114 respectively formed in the regions A and B are formed with relatively thin thickness, the MOS devices formed in the regions A and B may function as a core circuit device.

In an exemplary embodiment, one or both of the disclosed nitridation processes 110 and 116 can be optional and performed according to the presence of silicon dioxide layer 108' and/or 114. By employment of nitridation processes using $NH_3$-plasma on the silicon dioxide layers 108' and 114 with relatively thin thicknesses, dielectric constant thereof can be increased and leakage currents of a MOS device utilizing these gate dielectrics can be reduced, thereby improving performance the MOS device with reduced gate dielectric thickness. The nitrogen concentration doped into the silicon dioxide layers 108' and 114 is about $10^{13}$~$10^{20}$ atoms/cm$^2$ and $10^{13}$~$10^{21}$ atoms/cm$^2$, respectively. The nitrogen concentration in the silicon dioxide layer 108 may exceed that in the silicon dioxide layer 114.

In addition, due to the nitridation processes using $NH_3$-plasma on the silicon dioxide layers 108' and 114 with relatively thin thicknesses, the physical oxide thickness of the silicon dioxide layers 108' and 114 is increased but the silicon dioxide layers 108' and 114 can still perform the same electrical thickness as an undoped silicon dioxide layer with thinner thickness.

Compared with the method disclosed in the United States Patent Application Publication No. US2005/0029600A1, that of the exemplary embodiment prevents over-etching or insufficient etching of the gate dielectric of different regions and makes it possible to form at least three types of gate dielectrics on one identical substrate.

The MOS transistors having three different types of gate dielectrics was manufactured on one identical substrate by combining procedures forming three types of gate dielectrics on one identical silicon substrate as described above and a method of forming the MOS transistor. The MOS transistors can be either NMOS transistors, PMOS transistors or combinations thereof. Formations of the conducting layers, spacers and source/drain regions are well known to those skilled in the art and can be properly modified and are not limited to that shown in FIG. 6.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a silicon-containing substrate with first, second, and third regions;
   forming first, second, and third gate stacks overlying a portion of the silicon-containing substrate in the first, second, and third regions respectively, wherein the first, second, and third gate stacks respectively have a conducting layer and first, second, and third gate dielectric layers formed between the conducting layer and the silicon-containing substrate;
   forming a spacer on opposing sidewalls of the each of the first, second, and third gate stacks, the spacer overlying a portion of the silicon-containing substrate in the first, second, and third regions, respectively; and
   forming a source/drain region in a portion of the silicon-containing substrate in the first, second, and third regions, the source/drain region being adjacent to the first, second, and third gate stacks, respectively, wherein the first, second, and third gate dielectric layers have various thicknesses and have been treated by $NH_3$-plasma, and at least one of the first, second, and third gate dielectric layers with various thicknesses has a nitrogen-concentratiion of about $10^{13} \sim 10^{21}$ atoms/cm² therein.

2. A method for forming a semiconductor device, comprising:

providing a silicon-containing substrate with first, second, and third regions;

oxidizing the silicon-containing substrate in a first ambient, forming a first silicon dioxide layer overlying the silicon-containing substrate in the first, second, and third regions, wherein the first oxide layer has a first thickness;

masking the first silicon dioxide layer in the first and third regions with a first patterned mask layer, exposing the first silicon dioxide layer in the second region;

removing the silicon dioxide layer from the second region, exposing a top surface of the silicon-containing substrate in the second region;

removing the first patterned mask layer;

oxidizing the silicon-containing substrate in a second ambient, forming a second silicon dioxide layer overlying the silicon-containing substrate in the second region and a thickened first silicon dioxide layer in the first and third regions of the silicon-containing substrate, wherein the second oxide layer has a second thickness and the thickened first silicon dioxide layer has a third thickness exceeding the second thickness;

masking the thickened first silicon dioxide layer in the first region and the second silicon dioxide layer in the second region with a second patterned mask layer, exposing the thickened first silicon dioxide layer in the third region;

removing the thickened first silicon dioxide layer from the third region, exposing a top surface of the silicon-containing substrate in the third region;

removing the second patterned mask layer, leaving the first silicon dioxide layer in the first region and the second oxide layer in the second region; and oxidizing the silicon-containing substrate in a third ambient, forming a third silicon dioxide layer overlying the silicon-containing substrate in the third region and a further thickened first silicon dioxide layer in the first region and a thickened second silicon dioxide layer in the second region, wherein the third silicon dioxide layer has a fourth thickness, the further thickened first silicon dioxide layer has a fifth thickness and the thickened second silicon dioxide layer has a sixth thickness, both exceeding the fourth thickness, wherein the first ambient comprises no $NH_3$ plasma and the second and third ambient comprise $NH_3$ plasma.

3. The method as claimed in claim 2, wherein oxidizing the silicon-containing substrate in a second ambient to form a second silicon dioxide layer overlying the silicon-containing substrate in the second region and a thickened first silicon dioxide layer in the first and third regions of the silicon-containing substrate are achieved in a rapid thermal process.

4. The method as claimed in claim 2, wherein oxidizing the silicon-containing substrate in a third ambient to form a third silicon dioxide layer overlying the silicon-containing substrate in the third region and a further thickened first silicon dioxide layer in the first region and a thickened second silicon dioxide layer in the second region are achieved in a rapid thermal process.

5. The method as claimed in claim 2, wherein the thickened second silicon dioxide layer or the third silicon dioxide layer is nitrogen-doped, having a nitrogen-concentration of about $10^{13} \sim 10^{17}$ atoms/cm² therein.

6. The method as claimed in claim 2, wherein the thickened second silicon dioxide layer and the third silicon dioxide layer are both nitrogen-doped, having a nitrogen-concentration of about $10^{13} \sim 10^{17}$ atoms/cm² therein.

7. A method for forming a semiconductor device, comprising:

providing a silicon-containing substrate with first, second, and third regions;

oxidizing the silicon-containing substrate in a first ambient, forming a first silicon dioxide layer overlying the silicon-containing substrate in the first, second, and third regions, wherein the first oxide layer has a first thickness;

masking the first silicon dioxide layer in the first and third regions with a first patterned mask layer, exposing the first silicon dioxide layer in the second region;

removing the silicon dioxide layer from the second region, exposing a top surface of the silicon-containing substrate in the second region;

removing the first patterned mask layer;

oxidizing the silicon-containing substrate in a second ambient, forming a second silicon dioxide layer overlying the silicon-containing substrate in the second region and a thickened first silicon dioxide layer in the first and third regions, wherein the second oxide layer has a second thickness and the thickened first silicon dioxide layer has a third thickness exceeding the second thickness;

treating the silicon-containing substrate with $NH_3$-containing plasma, doping the thickened first silicon dioxide layer and the second silicon dioxide layer with nitrogen atoms;

masking the thickened first silicon dioxide layer in the first region and the second silicon dioxide layer in the second region with a second patterned mask layer, exposing the thickened first silicon dioxide layer in the third region;

removing the thickened first silicon dioxide layer in the third region, exposing a top surface of the silicon-containing substrate in the third region;

removing the second patterned mask layer, leaving the first silicon dioxide layer in the first region and the second oxide layer in the second region;

oxidizing the silicon-containing substrate in a third ambient, forming a third silicon dioxide layer overlying the silicon-containing substrate in the third region, a further thickened first silicon dioxide layer in the first region, and a thickened second silicon dioxide layer in the second region, wherein the third silicon dioxide layer has a fourth thickness, the further thickened first silicon dioxide layer in the first region has a fifth thickness and the thickened second silicon dioxide layer in the second region has a sixth thickness, both exceeding the fourth thickness; and treating the silicon-containing substrate with a $NH_3$-containing plasma, thereby doping the further thickened first silicon dioxide layer, the thickened second silicon dioxide layer and the third silicon dioxide layer with nitrogen atoms.

8. The method as claimed in claim 7, wherein the thickened second silicon dioxide layer and the third silicon dioxide layer have nitrogen atoms of about $10^{13} \sim 10^{17}$ atoms/cm² and $10^{13} \sim 10^{21}$ atoms/cm², respectively.

9. The method as claimed in claim 7, wherein the thickened second silicon dioxide layer and the third silicon dioxide layer have nitrogen atoms of about $10^{13}$~$10^{17}$ atoms/cm$^2$ and $10^{13}$~$10^{21}$ atoms/cm$^2$, respectively.

10. The method as claimed in claim 7, wherein oxidizing the silicon-containing substrate in a second ambient to form a second silicon dioxide layer overlying the silicon-containing substrate in the second region and a thickened first silicon dioxide layer in the first and third regions of the silicon-containing substrate are achieved in a furnace process.

11. The method as claimed in claim 7, wherein oxidizing the silicon-containing substrate in a third ambient to form a third silicon dioxide layer overlying the silicon-containing substrate in the third region, an further thickened first silicon dioxide layer in the first region and a thickened second silicon dioxide layer in the second region are achieved in a furnace process.

* * * * *